United States Patent [19]
Pelly

[11] Patent Number: 6,060,792
[45] Date of Patent: May 9, 2000

[54] INSTANTANEOUS JUNCTION TEMPERATURE DETECTION

[75] Inventor: Brian R. Pelly, Palos Verdes Estates, Calif.

[73] Assignee: International Rectifier Corp., El Segundo, Calif.

[21] Appl. No.: 09/080,600

[22] Filed: May 18, 1998

Related U.S. Application Data

[60] Provisional application No. 60/047,234, May 20, 1997.

[51] Int. Cl.⁷ .................................................. H01H 35/00
[52] U.S. Cl. ........................................... 307/117; 307/125
[58] Field of Search ..................................... 307/112, 116, 307/117, 125, 130, 131, 139; 361/18, 88, 91, 89, 93, 94, 98; 323/265, 271, 276

[56] References Cited

U.S. PATENT DOCUMENTS

| | | | |
|---|---|---|---|
| 4,721,869 | 1/1988 | Okado | 326/14 |
| 5,200,878 | 4/1993 | Sasagawa et al. | 361/93 |
| 5,485,341 | 1/1996 | Okado et al. | 361/98 |
| 5,596,466 | 1/1997 | Ochi | 361/18 |
| 5,608,595 | 3/1997 | Gourab et al. | 361/79 |
| 5,635,823 | 6/1997 | Murakami et al. | 323/277 |
| 5,828,539 | 10/1998 | Bijlenga et al. | 361/93 |
| 5,852,538 | 12/1998 | Masui | 361/18 |
| 5,898,554 | 4/1999 | Schnetzka et al. | 361/18 |

*Primary Examiner*—Jeffrey Gaffin
*Assistant Examiner*—Peter Zura
*Attorney, Agent, or Firm*—Ostrolenk, Faber, Gerb & Soffen, LLP

[57] ABSTRACT

A circuit, for detecting a junction temperature of an insulated gate bipolar transistor (IGBT) which is alternately biased on and off in response to a gate signal, includes a differentiator circuit operable to receive a collector to emitter voltage of the IGBT and produce an output voltage proportional to a rate at which the collector to emitter voltage changes; and a feedback circuit operable to receive the output voltage and alter the gate signal when the output voltage indicates that the rate at which the collector to emitter voltage changes is outside a predetermined limit.

19 Claims, 3 Drawing Sheets

INSTANTANEOUS JUNCTION TEMPERATURE DETECTION

CROSS REFERENCE TO RELATED APPLICATION

This application is based on and claims priority to U.S. Provisional Patent Application Ser. No. 60/047,234, filed May 20, 1997, entitled INSTANTANEOUS JUNCTION TEMPERATURE DETECTION.

BACKGROUND

1. Field of the Invention

The present invention relates to circuits employing insulated gate bipolar transistors (IGBTs) and, more particularly, to power circuits using IGBTs as switches where the instantaneous junction temperatures of the IGBTs are of concern.

2. Related Art

IGBTs are often used in pulse width modulated (PWM) power circuits such as motor control circuits, power supplies, etc. The junction temperature of the IGBTs in such power circuits must not exceed critical temperature values during the operation of the circuits or else device and/or circuit failures will result. Designers of power circuits using IGBTs typically design the circuits with operating safety margins which arbitrarily limit the output power of the circuits in the hope of maintaining the junction temperature of the IGBTs well below the critical values.

Unfortunately, such operating safety margins may needlessly restrict the output power of the power circuits when conservative margins are used in the designs. It is therefore desirable to monitor the instantaneous junction temperature of an IGBT in a power circuit and limit the power output of the circuit only when the junction temperature of the IGBT exceeds a threshold. Such monitoring may be accomplished in closed loop fashion (employing temperature feedback) which would allow the IGBT to operate within its safe temperature limit without needlessly restricting output power.

FIG. 1 shows the relationship between voltage, current and junction temperature in an IGBT. The curves labeled "Voltage" represent the voltage across the collector and emitter terminals of an IGBT in a bridge circuit driving an inductive load when the IGBT is turned off. Naturally, at turn off, the current from collector to emitter in the IGBT ramps down after the voltage ramps up. As shown, the rate at which the IGBT voltage increases (dv/dt) is substantially higher at low junction temperatures than at high temperatures.

SUMMARY OF THE INVENTION

The present invention capitalizes on the fact that the rate of rise of voltage across an IGBT during turn off decreases as the junction temperature increases. More particularly, the circuit of the present invention monitors the dv/dt of an IGBT and uses same to determine the IGBT instantaneous junction temperature. The instantaneous junction temperature is then used in a feedback loop to adjust the gating of the IGBT to lower the output power of the circuit and/or shut down the circuit altogether when junction temperature is too high.

The circuit of the present invention specifies a circuit, for detecting a junction temperature of an insulated gate bipolar transistor (IGBT) which is alternately biased on and off in response to a gate signal, including a differentiator circuit operable to receive a collector to emitter voltage of the IGBT and produce an output voltage proportional to a rate at which the collector to emitter voltage changes; and a feedback circuit operable to receive the output voltage and alter the gate signal when the output voltage indicates that the rate at which the collector to emitter voltage changes is outside a predetermined limit.

Other features and advantages of the present invention will become apparent from the following description of the invention which refers to the accompanying drawings.

BRIEF DESCRIPTION OF THE DRAWINGS

For the purpose of illustrating the invention, there are shown in the drawings forms which are presently preferred, it being understood, however, that the invention is not limited to the precise arrangements and instrumentalities shown.

DETAILED DESCRIPTION OF THE PREFERRED EMBODIMENT

Figure 2:
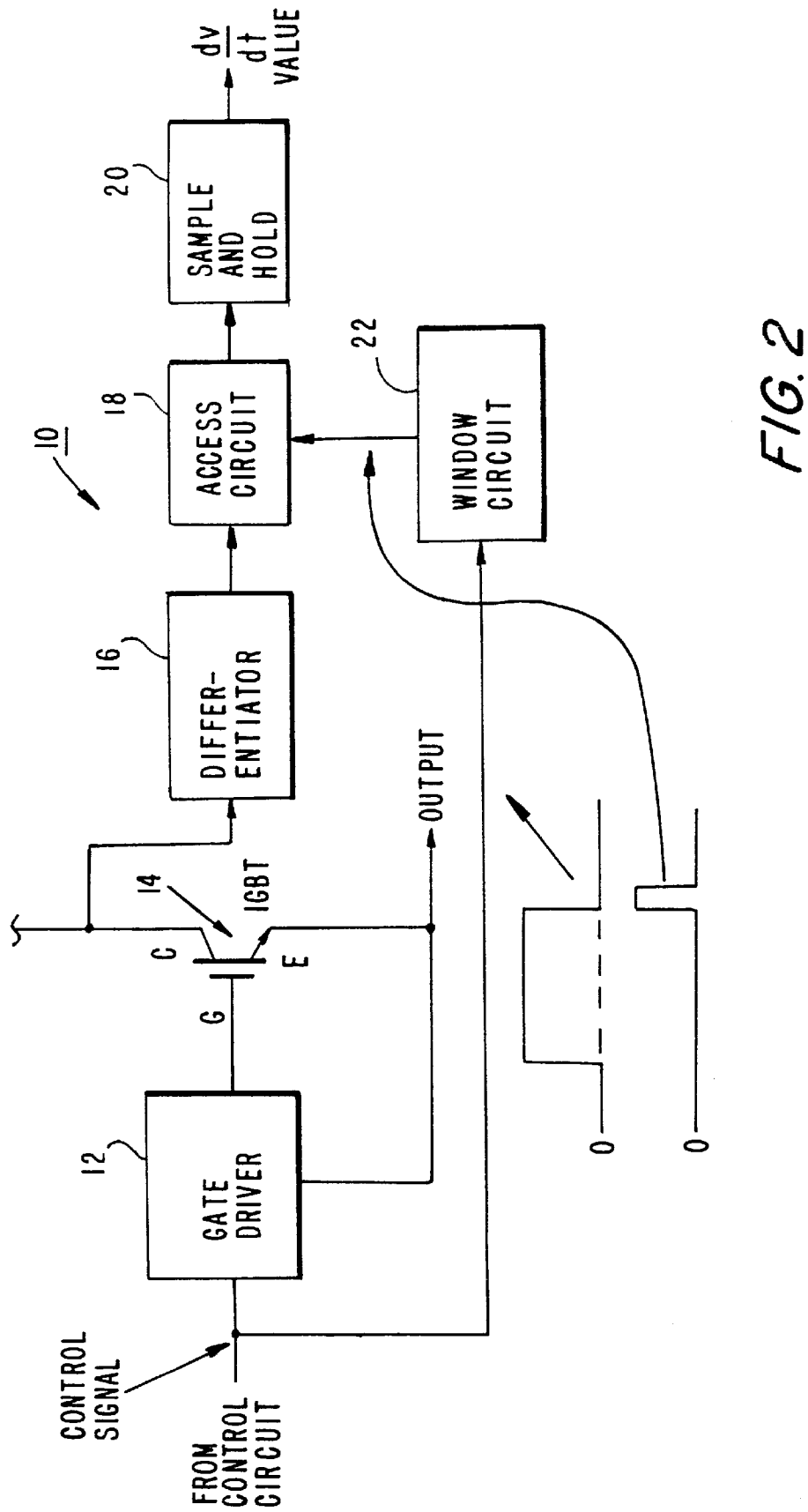
FIG. 2 shows a block diagram showing an IGBT junction temperature sensing circuit of the present invention.

Referring to the drawings wherein like numerals indicate like elements, there is shown in FIG. 2 a block diagram showing the IGBT junction temperature sensing circuit 10 of the present invention. The circuit includes a gate driver 12, an IGBT 14, a differentiator circuit 16, an access circuit 18, a sample and hold (S/H) circuit 20 and a window circuit 22.

As is known in the art, the gate driver 12 alternately biases the IGBT 14 on and off in accordance with a control signal from a control circuit (not shown) to obtain a desired waveform (for example, a PWM waveform) at the "output" terminal. When the power circuit 10 is a PWM power circuit, the IGBT 14 is used as a switch and, at turn on, the gate driver 12 provides sufficient voltage across the gate (G) and emitter (E) terminals of the IGBT 14 to saturate the IGBT (i.e., reduce the collector to emitter voltage to about 1 volt).

Figure 1A:
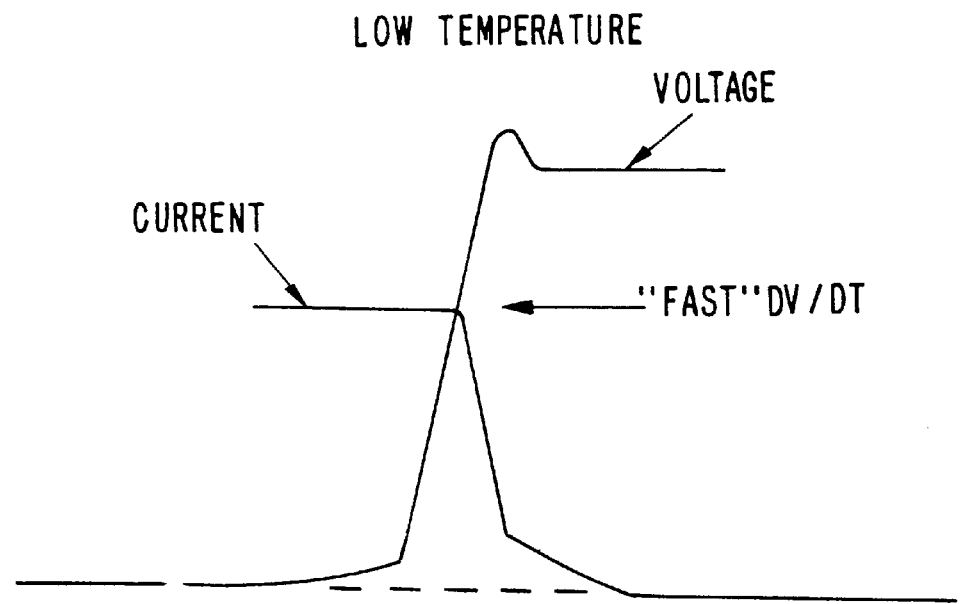
FIGS. 1a and 1b is a timing diagram showing the relationship between the voltage and current rise and fall times in an IGBT at low and high junction temperatures.
Figure 1B:
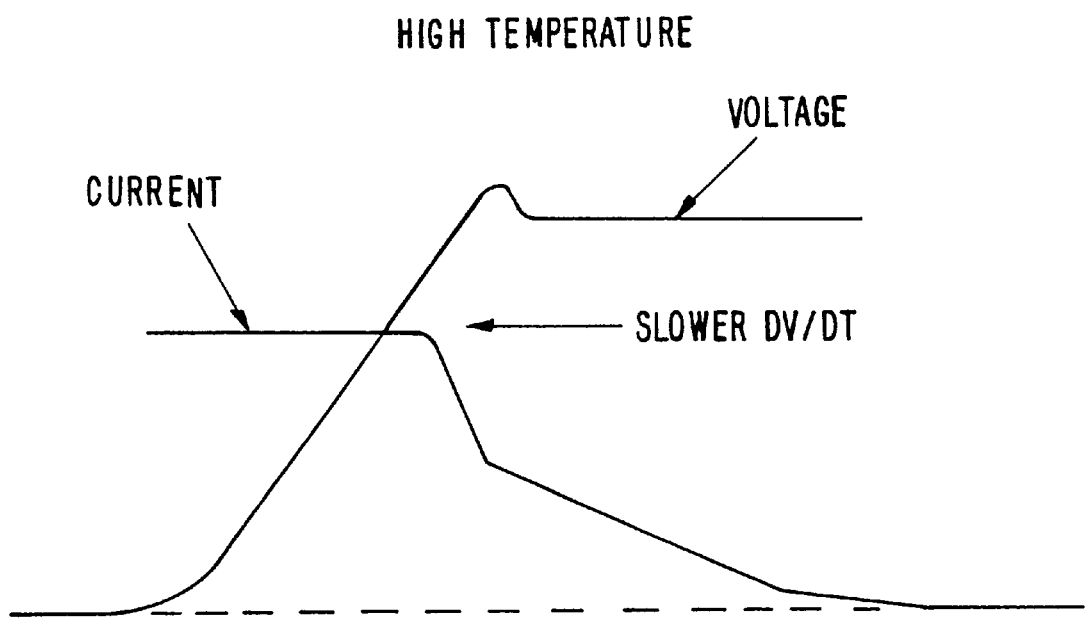

At turn off, the gate driver 12 reduces the gate to emitter voltage of the IGBT 14 such that the voltage across the collector to emitter ramps up (from about 1 volt) at a rate of dv/dt (FIG. 1) and, thereafter, the current through the collector to emitter ramps down.

The collector terminal (C) of the IGBT 14 is coupled to the differentiator circuit 16. The differentiator circuit 16 is capable of monitoring the rate at which the collector to emitter voltage of the IGBT 14 rises (or falls). Thus, the output of the differentiator circuit 16 is proportional to the dv/dt across the IGBT 14. Such differentiator circuits 16 which output analog voltages corresponding to an input dv/dt are well known in the art.

The output from the differentiator circuit 16 is input to the access circuit 18. The access circuit 18 also receives input from the window circuit 22. The access circuit 18 functions to switch (or gate) the output from the differentiator circuit 16 to the S/H circuit 20 at a predetermined time. Specifically, the window circuit 22 monitors the input signal from the control circuit to the gate driver 12. When the control circuit changes the level of the control signal from high to low (i.e., during turn off of the IGBT) the window circuit 22 presents a positive going pulse (a window of about 1–2 microseconds) to the access circuit 18 which indicates that the output from the differentiator circuit 16 should be gated to the S/H circuit 20.

Edge sensitive circuits which are suitable for use as a window circuit 22 are well known in the art. Similarly, access circuits 18 which gate input voltages in accordance with control pulses are also known in the art.

The S/H circuit 20 captures a value corresponding to the dv/dt of the IGBT 14 at a first turn off time and then is updated at successive turn off times. The output of the S/H circuit 20 is thus related to the instantaneous junction temperature of the IGBT 14.

It is understood that the output of the S/H circuit 20 is input to the control circuit (not shown) for use in controlling the circuit 10. In particular, a control program within the control circuit may receive the successive dv/dt values from the S/H circuit 20 and take appropriate action when a dv/dt value indicates an over temperature condition. If the control program determines that a dv/dt value indicates an over temperature condition, the control circuit may reduce the PWM duty cycle, shut down the power circuit 10 and/or take some other appropriate measure.

In practice, different IGBTs may have different dv/dt (at turn off) vs. junction temperature characteristics. Therefore, the control software may require calibration in accordance with the particular IGBT 14 used in the power circuit 10 during initial set-up of the total powertrain system.

Figure 3:
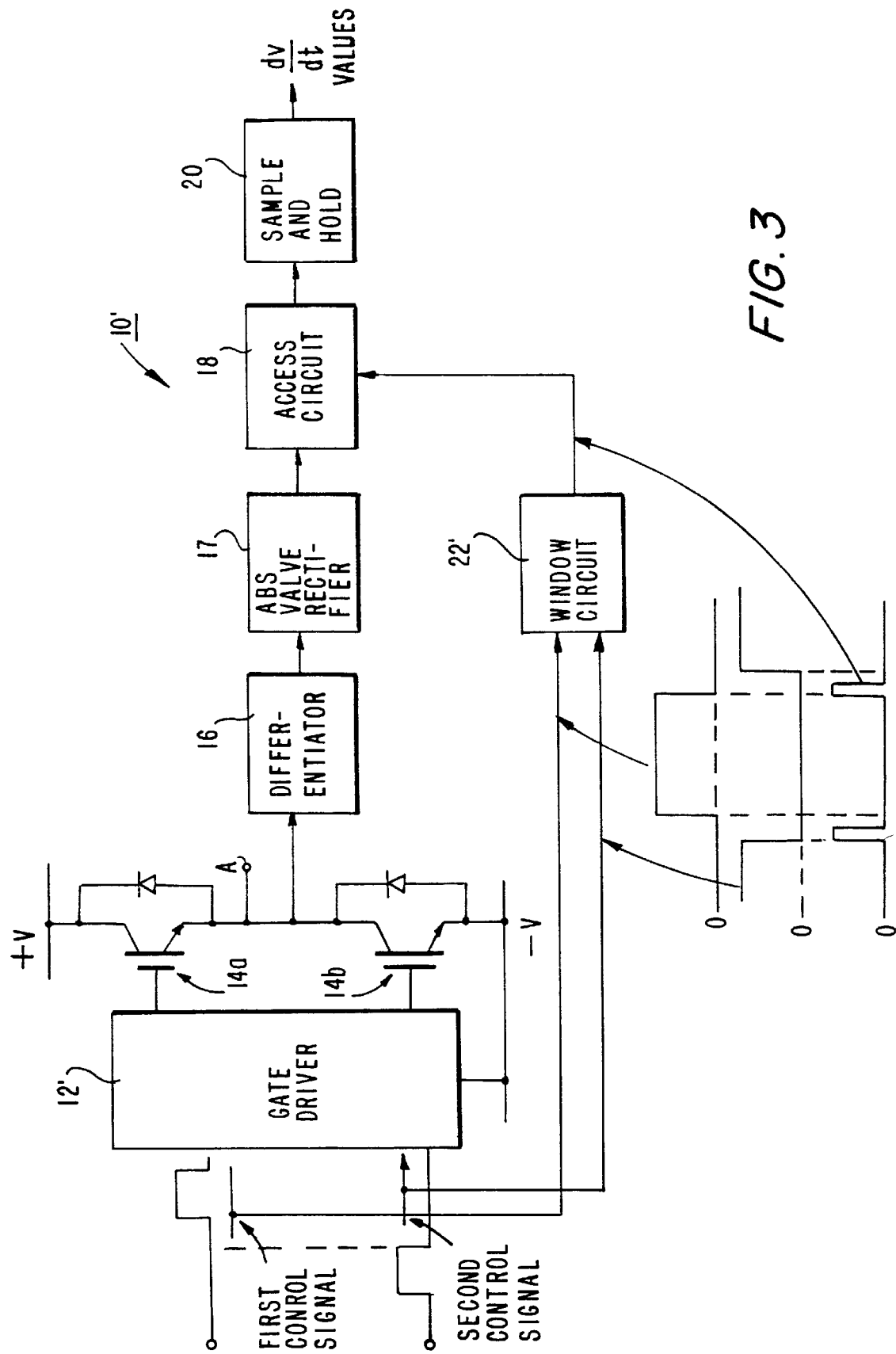
FIG. 3 shows a block diagram showing an IGBT junction temperature sensing circuit for a half bridge IGBT power circuit in accordance with the present invention.

Referring to FIG. 3, a power circuit 10' is in the form of a half bridge having a series pair of IGBTs 14a, 14b connected across a source of positive DC voltage, +V, and negative DC voltage, −V. Power output from the power circuit 10' is taken from node A. It is noted that the power circuit 10' may represent one phase of a three phase inverter circuit which produces a three phase AC output voltage to drive, for example, an AC motor, or the like.

The power circuit 10' also includes a gate driver 12' for alternately biasing the IGBTs 14a, 14b on and off in accordance with first and second control signals provided by a control circuit (not shown) as is known in the art. It is understood that the control circuit provides a sufficient dead band between turn off and turn on as is also known in the art.

The power circuit 10' further includes a differentiator circuit 16 which may be substantially similar to the differentiator circuit 16 as shown in FIG. 2. The differentiator circuit 16 receives the voltage signal at node A of the half bridge with the following result: During turn off of IGBT 14b, the sensed dv/dt is positive; however, during turn off of IGBT 14a, the sensed dv/dt is negative. Consequently, an absolute value rectifier 17 is included in series with the differentiator circuit 16 to make positive any sensed negative dv/dt values. Thus, the access circuit 18 receives a positive input signal during the pulses presented by the window circuit 22' independent of which IGBT, 14a or 14b, is turned off.

The window circuit 22' receives the first and second control signals as inputs and produces a pulse (a window) at each transition from high to low thereof. It is noted that the width of the pulses must be shorter than the dead time between the firing signals for the IGBTs 14a, 14b to exclude "false" dv/dt inputs to the differentiator circuit 16 when the anti-parallel diodes are being commutated.

The access circuit 18 and S/H circuit 20 operate in a substantially similar way as described above with respect to FIG. 2. It is noted that successive dv/dt values at the output of the S/H circuit 20 alternately represent the junction temperatures of the IGBT 14a and the IGBT 14b. Further, the control circuit (not shown) operates to reduce the power output of the circuit 10' as described above when the sensed dv/dt of one or both of the IGBTs 14a, 14b is excessive.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A circuit for detecting a junction temperature of an insulated gate bipolar transistor (IGBT), the IGBT being alternately biased on and off in response to a gate signal to control an amount of output current, the circuit comprising:

a differentiator circuit operable to receive a collector to emitter voltage of the IGBT and produce an output voltage proportional to a rate at which the collector to emitter voltage changes; and a feedback circuit operable to receive the output voltage and alter the gate signal when the output voltage indicates that the rate at which the collector to emitter voltage changes is outside a predetermined limit.

2. The circuit of claim 1, wherein the feedback circuit alters the gate signal such that the average amount of output current is reduced when the output voltage indicates that the rate at which the collector to emitter voltage changes is outside the predetermined limit.

3. The circuit of claim 1, wherein the rate at which the collector to emitter voltage changes when the IGBT is biased off reduces in proportion to an increase in the junction temperature.

4. The circuit of claim 3, wherein the feedback circuit alters the gate signal when the output voltage indicates that the rate at which the collector to emitter voltage changes has fallen below a predetermined value.

5. The circuit of claim 4, wherein the predetermined value is a function of a type of IGBT to be utilized.

6. The circuit of claim 1, further comprising a enabling circuit operable to permit the feedback circuit to receive the output voltage from the differentiator circuit only during predetermined times.

7. The circuit of claim 6, wherein the predetermined times are when the IGBT is biased off.

8. The circuit of claim 7, wherein the enabling circuit includes:

an access circuit operable to permit the feedback circuit to receive the output voltage from the differentiator circuit in response to a window signal; and a window circuit operable to produce the window signal when the IGBT has been biased off.

9. The circuit of claim 8, wherein the window circuit receives the gate signal and produces the window signal in the form of a pulse having a predetermined duration, the pulse initiating when the gate signal biases the IGBT off.

10. The circuit of claim 6, wherein the feedback circuit includes a sample and hold circuit operable to receive the output voltage from the enabling circuit during the predetermined times such that a sampled voltage representative of the output voltage at one of the predetermined times is available in the feedback circuit at times other than that predetermined time.

11. A circuit for detecting junction temperatures of at least first and second insulated gate bipolar transistors (IGBTs) of at least one half bridge circuit, the IGBTs being alternately biased on and off in response to first and second gate signals, respectively, to produce an output current, the circuit comprising:

a differentiator circuit operable to receive an input voltage from a node connecting an emitter of the first IGBT and a collector of the second IGBT, the differentiator circuit producing an output voltage proportional to a rate at which the input voltage changes; and a feedback circuit operable to receive the output voltage and alter the first and second gate signals when the output voltage indicates that the rate at which the input voltage changes is outside predetermined limits.

12. The circuit of claim 11, wherein the feedback circuit alters the first and second gate signals such that the average output current is reduced when the output voltage indicates that the rate at which the input voltage changes is outside the predetermined limits.

13. The circuit of claim 11, wherein the rate at which the input voltage changes when the first or second IGBT is biased off reduces in proportion to an increase in junction temperature.

14. The circuit of claim 13, wherein the output voltage includes a first part having a negative sense indicative of a negatively going rate caused by the first IGBT being biased off and a second part having a positive sense indicative of a positively going rate caused by the second IGBT being biased off, and the feedback circuit altering the first and second gate signals when the output voltage indicates that the positively going or negatively going rate at which the input voltage changes has fallen below a predetermined value.

15. The circuit of claim 14, further comprising an absolute value circuit operable to receive the output voltage from the differentiator circuit and produce a rectified output voltage where the negative sense of the first part is made positive.

16. The circuit of claim 15, further comprising a enabling circuit operable to permit the feedback circuit to receive the rectified output voltage from the absolute value circuit only when the first or second IGBT is biased off.

17. The circuit of claim 16, wherein the enabling circuit includes:

an access circuit operable to permit the feedback circuit to receive the rectified output voltage from the absolute value circuit in response to a window signal; and a window circuit operable to produce the window signal when at least one of the first and second IGBTs has been biased off.

18. The circuit of claim 17, wherein the window circuit receives the first and second gate signals and produces the window signal in the form of a pulse having a predetermined duration, the pulse initiating when at least one of the first and second gate signals bias a respective IGBT off.

19. The circuit of claim 16, wherein the feedback circuit includes a sample and hold circuit operable to receive the output voltage from the enabling circuit during the predetermined times such that a sampled voltage representative of the rectified output voltage at one of the predetermined times is available in the feedback circuit at times other than that predetermined time.

* * * * *